United States Patent
West et al.

(10) Patent No.: US 11,024,576 B1
(45) Date of Patent: Jun. 1, 2021

(54) SEMICONDUCTOR PACKAGE WITH UNDERFILL BETWEEN A SENSOR COIL AND A SEMICONDUCTOR DIE

(71) Applicant: TEXAS INSTRUMENTS INCORPORATED, Dallas, TX (US)

(72) Inventors: Jeffrey Alan West, Dallas, TX (US); Byron Lovell Williams, Plano, TX (US); Thomas Dyer Bonifield, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/732,296

(22) Filed: Dec. 31, 2019

(51) Int. Cl.
*H01L 23/522* (2006.01)
*H01L 23/498* (2006.01)
*H01L 43/04* (2006.01)
*H01L 21/48* (2006.01)
*H01L 21/56* (2006.01)

(52) U.S. Cl.
CPC ...... *H01L 23/5227* (2013.01); *H01L 21/4821* (2013.01); *H01L 21/563* (2013.01); *H01L 23/49861* (2013.01); *H01L 43/04* (2013.01)

(58) Field of Classification Search
CPC . G01R 33/07–098; H01L 43/04; H01L 43/06; H01L 43/065; H01L 41/125
See application file for complete search history.

(56) References Cited

U.S. PATENT DOCUMENTS

| | | | |
|---|---|---|---|
| 7,112,950 B2 | 9/2006 | Reinhold et al. | |
| 9,299,697 B2 | 3/2016 | West et al. | |
| 9,525,021 B2 | 12/2016 | West et al. | |
| 9,583,558 B2 | 2/2017 | West et al. | |
| 9,793,106 B2 | 10/2017 | Guo et al. | |
| 9,885,743 B2 | 2/2018 | Makinson et al. | |
| 10,126,327 B2 | 11/2018 | Morel et al. | |
| 2006/0219436 A1* | 10/2006 | Taylor | G01R 15/202 174/529 |
| 2007/0269930 A1 | 11/2007 | Gupta et al. | |
| 2017/0278768 A1* | 9/2017 | Higgins, III | H01L 21/4828 |
| 2018/0053745 A1* | 2/2018 | Cheng | H01L 24/20 |
| 2018/0076909 A1* | 3/2018 | Latham | H01L 25/0655 |
| 2018/0158765 A1* | 6/2018 | Montero | H01L 24/49 |

* cited by examiner

*Primary Examiner* — Syed I Gheyas
(74) *Attorney, Agent, or Firm* — Ronald O. Neerings; Charles A. Brill; Frank D. Cimino

(57) ABSTRACT

A semiconductor package includes a leadframe including a sensor coil between sensor coil leads and further including a plurality of die leads physically and electrically separated from the sensor coil, and a semiconductor die over the leadframe with die contacts electrically connected to the die leads. The semiconductor die includes a sensor operable to detect magnetic fields created by electrical current through the sensor coil, the semiconductor die operable to output a signal representative of the detected magnetic fields via the die leads. The semiconductor package further includes a dielectric underfill filling a gap between the sensor coil and the semiconductor die, and a dielectric mold compound covering the sensor coil and the dielectric underfill and at least partially covering the semiconductor die and the die leads.

29 Claims, 7 Drawing Sheets

SEMICONDUCTOR PACKAGE WITH UNDERFILL BETWEEN A SENSOR COIL AND A SEMICONDUCTOR DIE

TECHNICAL FIELD

This disclosure relates to semiconductor packages.

BACKGROUND

Current sensors may include a current path with a sensor coil and an adjacent magnetic sensor, such as a Hall effect sensor, which detects an electromagnetic field emanating from the sensor coil from current through the sensor coil. Electrical isolation between the sensor coil and the sensor is required. However, the sensitivity of the current sensor depends on spacing between the sensor coil and the sensor, with the spacing gap being inversely related to sensor sensitivity.

Within the present application and as currently described in the power circuits industry, low voltage is considered as below 50 volts, high voltage is defined as a voltage greater than 50 volts and less than 5,000 volts. Extra-high voltage is a voltage greater than 5,000 volts. Particularly with respect to high voltage and extra-high voltage, a sensor coil and sensor may be implemented separately within a semiconductor package rather than as part of an integrated circuit.

In order to provide electrical isolation between the sensor coil and a semiconductor die including a sensor, a semiconductor die including a magnetic sensor may be separated from a sensor coil by a gap filled with a dielectric mold compound that also covers the semiconductor die and the sensor coil to form a semiconductor package.

BRIEF SUMMARY

Semiconductor packages disclosed herein include a sensor coil and a semiconductor die with a magnetic sensor configured to detect magnetic fields from current through the sensor coil. Underfill is located within a gap between the sensor coil and the semiconductor die. Mold compound covers the semiconductor die, the underfill, and the sensor coil. Compared to examples in which mold compound is used without underfill to fill the gap between the semiconductor die and the sensor coil, the disclosed techniques may provide better electrical isolation, which may improve the performance and/or reliability of the semiconductor package.

In one example, a semiconductor package includes a leadframe including a sensor coil between sensor coil leads and further including a plurality of die leads physically and electrically separated from the sensor coil, and a semiconductor die over the leadframe with die contacts electrically connected to the die leads. The semiconductor die includes a sensor operable to detect magnetic fields created by electrical current through the sensor coil, the semiconductor die operable to output a signal representative of the detected magnetic fields via the die leads. The semiconductor package further includes a dielectric underfill filling a gap between the sensor coil and the semiconductor die, and a dielectric mold compound covering the sensor coil and the dielectric underfill and at least partially covering the semiconductor die and the die leads.

In another example, a method for fabricating a semiconductor package includes mounting a semiconductor die to a leadframe, the leadframe including a sensor coil between sensor coil leads and further including a plurality of die leads physically and electrically separated from the sensor coil. Mounting the semiconductor die to the leadframe includes electrically connecting die contacts of the leadframe to the die leads. The semiconductor die includes a sensor operable to detect magnetic fields created by electrical current through the sensor coil, the semiconductor die operable to output a signal representative of the detected magnetic fields via the die leads. The method further includes dispensing a dielectric underfill to fill a gap between the sensor coil and the semiconductor die, and molding a dielectric mold compound to cover the sensor coil and the dielectric underfill and at least partially cover the semiconductor die and the die leads.

DETAILED DESCRIPTION

Figure 1A:
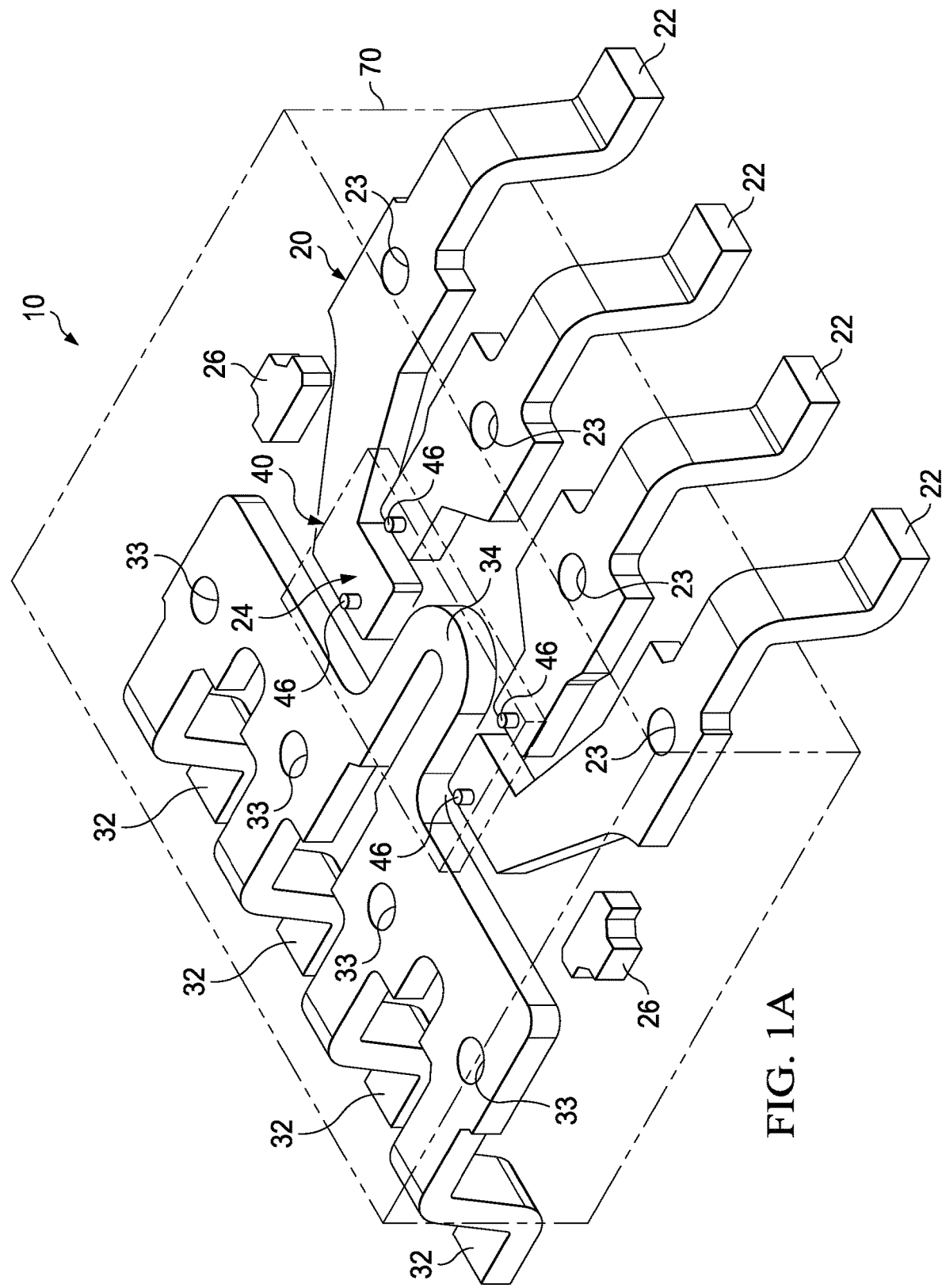
FIGS. 1A-1D illustrate a semiconductor package including underfill within a gap between a sensor coil and a semiconductor die of the semiconductor package.

As disclosed herein, a semiconductor package includes a sensor coil and a semiconductor die with a magnetic sensor configured to detect magnetic fields from electrical current through the sensor coil. The semiconductor package further includes underfill within a gap between the sensor coil and the semiconductor die. Mold compound covers the semiconductor die, the sensor coil, and the underfill. Compared to examples in which mold compound is used without underfill to fill a gap between the semiconductor die and the sensor coil, the disclosed techniques may provide better electrical isolation, which may improve the performance and/or reliability of the semiconductor package.

Semiconductor packages with an alternative design that included mold compound to fill a gap between a semiconductor die and a sensor coil were subjected to failure mode testing. During the failure mode testing, electrical current at or exceeding the rating of the semiconductor package was applied to the sensor coil to produce a short between the sensor coil and the semiconductor die. Due to the concentration of current at a boundary of a conductor, prior to testing, primary failure was expected to occur between the sensor coil and the semiconductor die along edges of the sensor coil. However, the testing revealed alternative failure modes. In particular, electrical shorts through the mold compound occurred between the sensor coil and the semiconductor die under the center of the sensor coil.

Testing and investigation revealed that shorts under the center of the sensor coil occurred in the presence of voids in mold compound used to fill the gap between the sensor coil and the semiconductor die. In particular, during a transfer molding process to cover the sensor coil and semiconductor die, for some semiconductor packages, flow of mold compound would enter the gap from either side of the sensor coil, trapping gas between the sensor coil and the semiconductor die, leaving a void. In some instances, the void was elongated, following a shape of the sensor coil.

The disclosed techniques address this unexpected failure mode. Specifically, the gap between the sensor coil and the semiconductor die is filled with underfill prior to molding the semiconductor package. In particular examples, the underfill is applied from only one side of the sensor coil, allowing the gap to be filled completely by capillary flow without trapping gas as occurred with the mold compound flow. Following the application of the underfill, the semiconductor die, the sensor coil, and the underfill may be covered with mold compound in a transfer molding process.

Further testing and investigation of examples of the new semiconductor package design, with underfill material filling the gap between the sensor coil and the semiconductor die, eliminated the unexpected failure mode of electrical shorts at the center of the sensor coil. In these examples, the primary failure occurred between the sensor coil and the semiconductor die along edges of the sensor coil, where the electric field concentrations of the sensor coil were the highest. Semiconductor package 10, as described with respect to FIGS. 1A-1D, provides one example of these techniques.

Figure 1B:
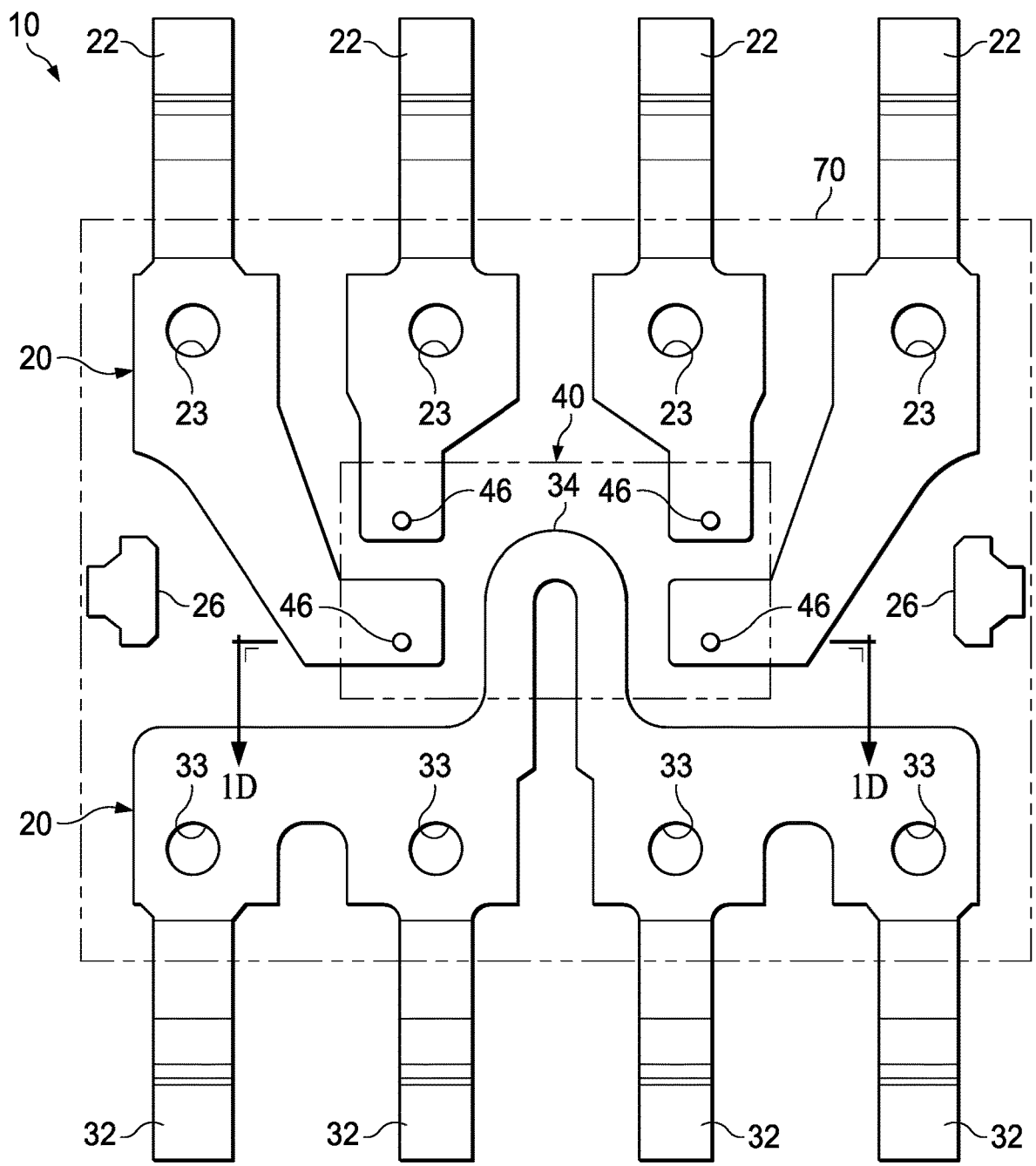
Figure 1C:
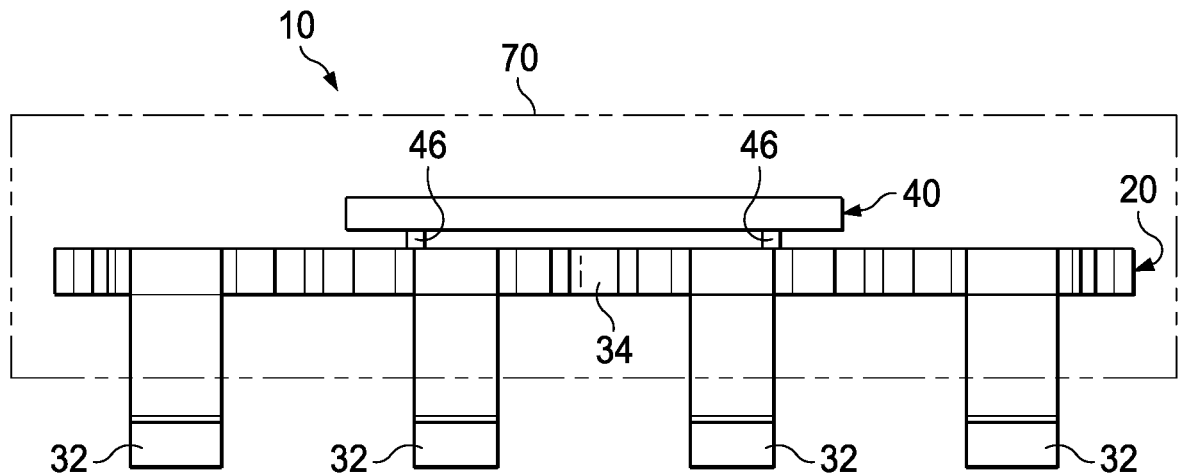
Figure 1D:
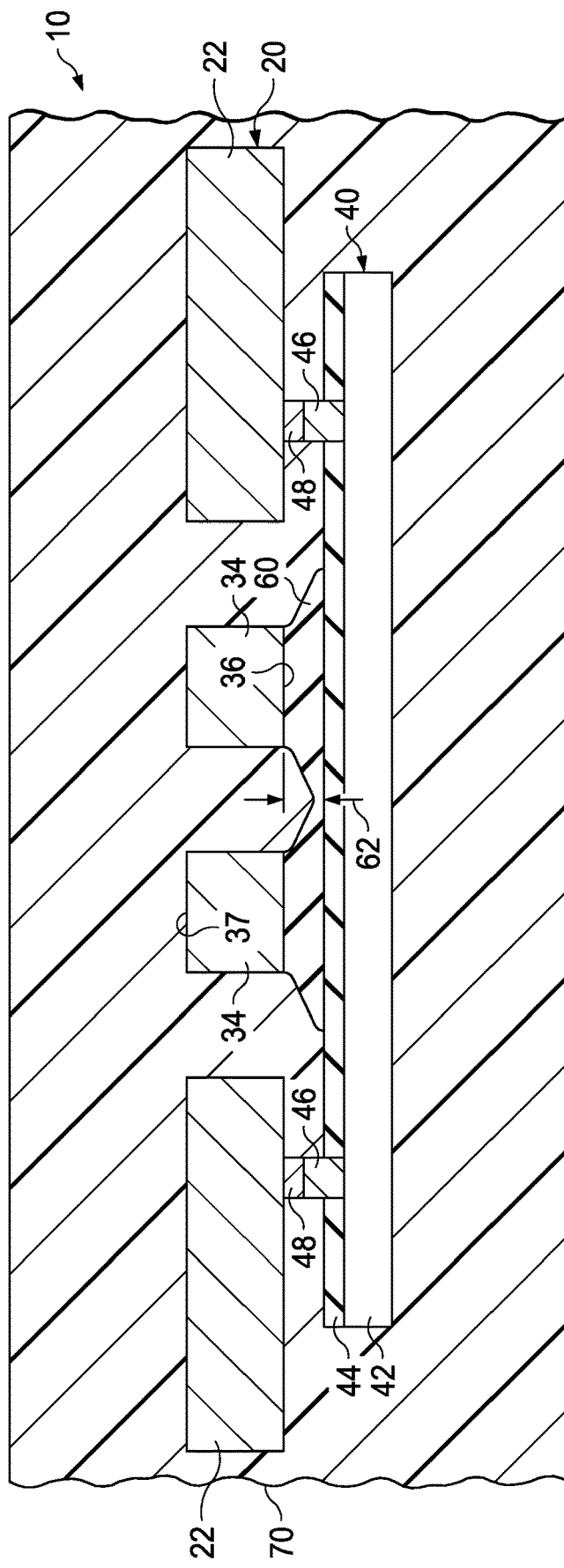

FIGS. 1A-1D illustrate semiconductor package 10. In particular, FIG. 1A is a perspective view of semiconductor package 10, while FIG. 1B is a top view of semiconductor package 10. FIG. 1C is a side view of semiconductor package 10, but without mold compound 70. FIG. 1D is a conceptual cutaway side view of semiconductor package 10.

Semiconductor package 10 includes a leadframe 20 including a sensor coil 34 between sensor coil leads 32 and further including a plurality of die leads 22 physically and electrically separated from sensor coil 34. Semiconductor die 40 is mounted to die attach site 24 of die leads 22 proximate to sensor coil 34 to facilitate sensing magnetic fields. Gap 62 separates semiconductor die 40 from sensor coil 34. Dielectric underfill 60 fills gap 62 to electrically isolate semiconductor die 40 from sensor coil 34.

Sensor coil 34 and sensor coil leads 32 form a continuous electrical conductor. Sensor coil 34 is a partial turn sensor coil, such as a half-turn sensor coil, formed in a planar profile with sensor coil leads 32 as part of leadframe 20. Surface 36 of leadframe 20 faces underfill 60 and semiconductor die 40. The opposing surface 37 is adjacent to mold compound 70.

Semiconductor die 40 includes a magnetic sensor, such as a Hall effect sensor, and is operable to output a signal representative of the detected magnetic fields via die leads 22. In some examples, semiconductor die 40 is an integrated circuit including the sensor and a controller configured to receive an analog input from the sensor and output a digital signal representative of electrical current through sensor coil 34 via one or more of die leads 22. In other examples, semiconductor die 40 may output an analog signal representing sensed magnetic fields via die leads 22.

Sensor coil leads 32 provide electrical contacts for connection to the current path being sensed, while die leads 22 provide electrical connections between semiconductor die 40 and external components, such as via a printed circuit board (PCB). In the example of semiconductor package 10, exposed portions of leads 22, 32 are bent in a common direction outside mold compound 70 and shaped as cantilevered leads. In other examples, leads 22, 32 may have other configurations, including but not limited to, a shape conforming to Small Outline No-Lead (SON) devices, such as Quad Flat No-Lead (QFN) devices.

As illustrated in FIG. 1D, semiconductor die 40 includes a semiconductor layer 42 including a magnetic sensor, and a dielectric layer 44 covering an active side of semiconductor layer 42. Dielectric layer 44 forms openings with copper pillars 46 exposed within the openings. In some examples, dielectric layer 44 may be a solder mask layer, such as a polyimide layer. In the same or different examples, semiconductor layer 42 may include silicon, gallium nitride (GaN), such as GaN-on-silicon or GaN-on-silicon carbide, gallium arsenide or another semiconductor architecture.

Semiconductor die 40 is over leadframe 20 with copper pillars 46 electrically connected to die leads 22 in a flip chip configuration. Copper pillars 46 are formed from a copper or copper alloy, as is common with metal pillars used as die contacts for mounting semiconductor dies in a flip chip configuration. Other examples may utilize other metals for metal pillars, such as gold or a gold alloy.

Copper pillars 46 face surface 36 of die leads 22, and copper pillars 46 include solder caps 48 electrically connecting copper pillars 46 to die leads 22 in the flip chip configuration. Specifically, copper pillars 46 extend through bond pad openings in dielectric layer 44 and are bonded to a metallization layer (not shown) in semiconductor layer 42. Solder caps 48 are on top of copper pillars 46. In some examples, solder caps 48 may be a lead-free solder, such as tin or tin-silver alloy.

For flip chip attachment of semiconductor die 40 to die attach site 24 of die leads 22, semiconductor die 40 is positioned with solder caps 48 in contact with die leads 22 at die attach site 24. The assembly is heated to reflow solder caps 48 at die attach site 24, thereby physically and electrically coupling copper pillars 46 with die leads 22. In this manner, copper pillars 46 represent the die contacts or bond pads of semiconductor die 40. Other die contacts may also be used, such as ball grid arrays or bond pads connecting to wire bonds.

Semiconductor layer 42 is separated from surface 36 of sensor coil 34 by gap 62, which is filled by underfill 60, as well as dielectric layer 44, which is part of semiconductor die 40. Gap 62 is filled with dielectric underfill 60 such that dielectric underfill 60 contacts dielectric layer 44 adjacent to copper pillars 46. In some particular examples, a thickness of dielectric layer 44 may be in a range of 5 micrometers ($\mu$m) to 20 $\mu$m such as 5 $\mu$m to 15 $\mu$m, such as at about 10 $\mu$m. As used herein, the term about refers to a range of manufacturing tolerances associated with the element being described. In the same or different particular examples, a thickness of underfill 60 at gap 62 may be in a range of 20 $\mu$m to 200 $\mu$m such as 50 $\mu$m to 100 $\mu$m, such as at about 70 $\mu$m. While applications outside these ranges may exist, for high voltage and extra-high voltage, small gaps may result in electrical shorts and larger gaps may reduce sensing resolution.

The height of gap 62 is set by the height of copper pillars 46. Generally speaking, a smaller gap will increase the intensity of a magnetic forces detectable by the sensor of semiconductor die 40 due to current through sensor coil 34. However, electrical isolation between sensor coil 34 and semiconductor die 40 is required. For a given application, these competing factors are balanced to provide suitable sensing characteristics and reliable operation of semiconductor package 10, without electrical shorting between semiconductor die 40 and sensor coil 34. Providing a solid dielectric material free of voids or substantially free of voids, such as underfill 60, is also important to protect against electrical shorts between sensor coil 34 and semiconductor die 40 as voids might increase instances of electrical shorts between sensor and semiconductor die 40. As referred to herein, substantially free of voids means lacking voids that materially impacting the electrically insulating performance of underfill 60.

In some examples, underfill 60 may be applied to gap 62 as a viscous polymeric precursor dispensed onto dielectric layer 44 (FIG. 1D) of semiconductor die 40 adjacent to sensor coil 34 and be pulled into gap 62 by capillary forces. In other examples, underfill 60 may be dispensed onto sensor coil 34 adjacent to semiconductor die 40 and be pulled into gap 62 by capillary forces; however, such examples would require underfill 60 to flow along a length of sensor coil 34 from the edge of semiconductor die 40, rather than a width of sensor coil 34 as when underfill is applied to semiconductor die 40 adjacent to sensor coil 34. In yet other examples, underfill 60 may be applied to either semiconductor die 40 or sensor coil 34 before semiconductor die 40 is mounted to die attach site 24. In any case, underfill 60 is substantially free of voids within gap 62 so as to mitigate occurrences of electrical shorting between sensor coil 34 and semiconductor die 40.

Following the filling of gap 62, the viscous polymeric precursor is cured to form a solid dielectric barrier of underfill 60 between sensor coil 34 and semiconductor die 40. In some examples, the precursor may be heated, polymerized and "cured" to form the solid dielectric barrier. In such examples, underfill 60 may include a resin such as an epoxy-based thermoset polymer. The resin of underfill 60 may be filled or unfilled and include one or more of the following: resin, hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected for a lower coefficient of thermal expansion, increase thermal conductivity, and/or increase elastic modulus of the underfill compared to the resin base. Particulate fillers may be selected to reduce strength characteristics such as tensile strength and flexural strength compared to the resin base materials.

A maximum diameter of fillers of underfill 60, if any, should be small enough to allow flow within gap 62. For example, underfill 60 may include particulate fillers, such as silica fillers, within a maximum diameter less than gap 62, such as no more than 95 percent of gap 62, such as no more than 75 percent of gap 62. In contrast, particulate fillers of mold compound 70, may have diameters equal to or greater than gap 62.

Leadframes, such as leadframe 20, including leads 22, 32 and sensor coil 34, are formed on a single, thin sheet of metal as by stamping or etching. In various examples, the base metal of leadframe 20 may include copper, copper alloys, aluminum, aluminum alloys, iron-nickel alloys, or nickel-cobalt ferrous alloys. For many devices, parallel surfaces of the flat leadframe base metal are treated to create strong affinity for adhesion to plastic compound, especially mold compounds. As an example, the surfaces of metal leadframes may be oxidized to create a metal oxide layer, such as copper oxide. Other methods include plasma treatment of the surfaces, or deposition of thin layers of other metals on the base metal surface. In some examples, the planar base metal may be plated with a plated layer enabling metal-to-metal bonding and resistant to oxidation. In an example, the plated layer may include a layer of nickel plated on the base metal and a layer of palladium plated on the nickel layer. Some of such examples, a layer of gold may be plated on the palladium layer. As an example for copper leadframes, plated layers of tin may be used, or a layer of nickel, about 0.5 to 2.0 μm thick in some examples, followed by a layer of palladium, about 0.01 to 0.1 μm thick in the same or different examples, optionally followed by an outermost layer of gold, about 0.003 to 0.009 μm thick in the same or different examples. Such base metal and plating combinations provide resistance to corrosion, such as oxidation, at exposed portions of the leadframe while facilitating the flip chip connection between leadframe 20 and semiconductor die 40 at die attach site 24.

Mold compound 70 forms an overmold covering semiconductor die 40, sensor coil 34, and underfill 60 and partially covering leads 22, 32. In this manner, mold compound 70 provides a protective outer layer for the electric components of semiconductor package 10.

In some examples, mold compound 70 includes a resin such as an epoxy-based thermoset polymer. The resin of mold compound 70 may be filled or unfilled and include one or more of the following: resin, hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower CTE, increase thermal conductivity, increase elastic modulus of the mold compound compared to the resin base. Particulate fillers may be selected to reduce strength characteristics such as tensile strength and flexural strength compared to the resin base materials. Some particulate fillers of mold compound 70 may have diameters greater than gap 62.

Die leads 22 form die lead apertures 23 filled with mold compound 70. Likewise, sensor coil leads 32 form sensor coil lead apertures 33 filled with mold compound 70. Apertures 23, 33 allow mold compound 70 to engage die leads 22 and coil leads 32. Such engagement may be particularly important to resist delamination of mold compound 70 from leads 22, 32 when bending leads 22, 32 into their cantilevered shapes following molding with mold compound 70.

Usually die mounting, die to lead attachment, such as flip chip bonding, and molding to cover at least part of the leadframe and dies take place while the leadframes are still integrally connected as a leadframe strip. After such processes are completed, the leadframes, and sometimes mold compound of a semiconductor package, are severed ("singulated" or "diced") with a cutting tool, such as a saw or laser, within spaces separating the semiconductor dies from each other. These singulation cuts separate the leadframe strip into separate semiconductor packages, each semiconductor package including a singulated leadframe, at least one die, electrical connections between the die and leadframe (such a flip chip connection or wire bonds) and the mold compound which covers at least part of these structures.

Tie bars, such as tie bars 26, and siderails of a leadframe strip are removed or partially removed during singulation of the semiconductor packages formed with a single leadframe strip. The term leadframe represents the portions of the leadframe strip remaining within a semiconductor package after singulation. With respect to semiconductor package 10, leadframe 20 includes die leads 22 with die attach site 24, sensor coil leads 32 and sensor coil 34 forming the current path, as well as tie bars 26, although some of these elements are not interconnected following singulation of semiconductor package 10 into a discrete semiconductor package.

Figure 3:
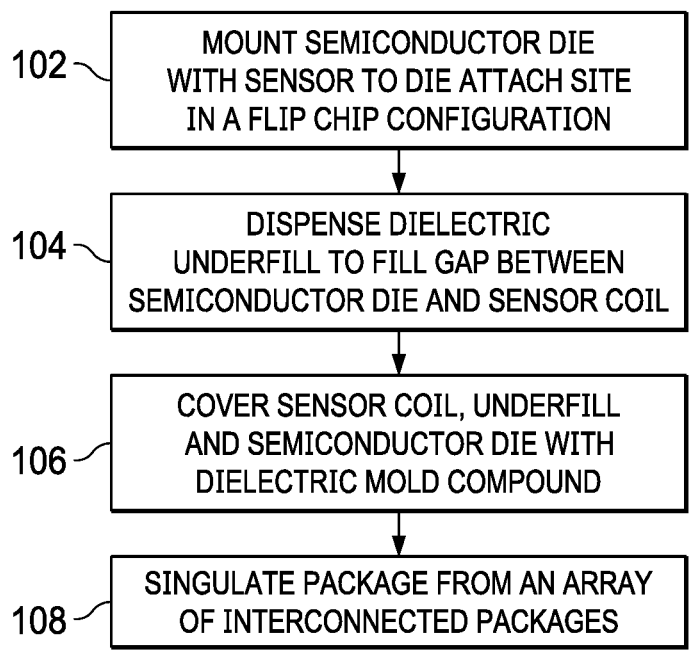
FIG. 3 is a flowchart of a method of manufacturing a semiconductor package including underfill within a gap between a sensor coil and a semiconductor die of the semiconductor package, such as the semiconductor package of FIGS. 1A-1D.
Figure 2A:
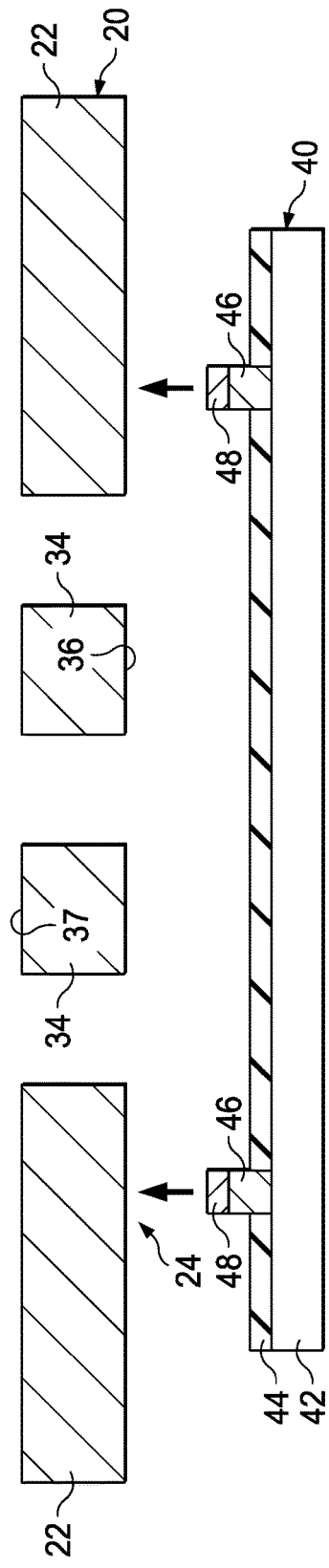
FIGS. 2A-2G illustrate conceptual process steps for manufacturing the semiconductor package of FIGS. 1A-1D.
Figure 2B:
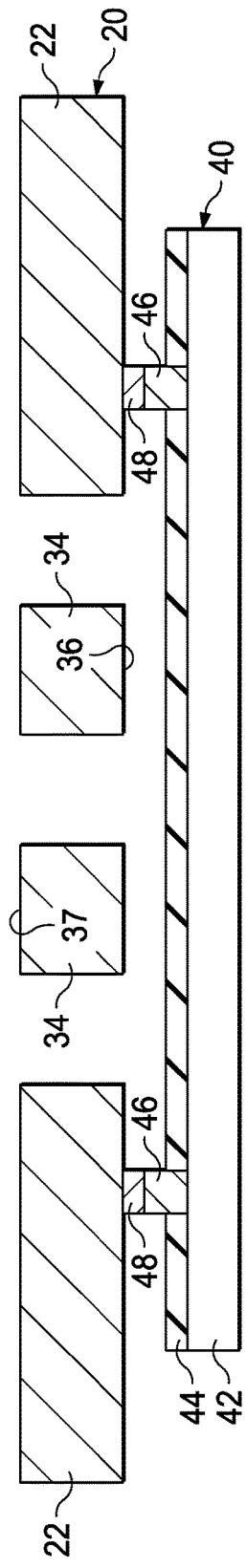

FIGS. 2A-2G are conceptual cutaway side views of process steps for manufacturing a semiconductor package 10 including underfill 60 between a sensor coil 34 and semiconductor die 40. The cutaway side views of FIGS. 2A-2G are from the same perspective as FIG. 1D. FIG. 3 is a flowchart of a method of manufacturing a semiconductor package including underfill within a gap between a sensor coil and a semiconductor die of the semiconductor package, such as semiconductor package 10. For clarity, the method of FIG. 3 is described with reference to semiconductor package 10 and FIGS. 2A-2G; however, the described techniques may be adapted to other semiconductor package designs and are not limited to the specific example of semiconductor package 10. As shown in FIGS. 2A and 2B, semiconductor die 40 is mounted on die attach site 24 of die leads 22 of leadframe in a flip chip configuration (FIG. 3, step 102). Mounting semiconductor die 40 to die attach site 24 includes reflowing a set of solder caps 48 on copper pillars 46 of semiconductor die 40 to form electrical connections between copper pillars 46 and die leads 22.

As shown in FIGS. 2C-2F, underfill 60 is dispensed to fill gap 62 between sensor coil 34 and semiconductor die 40 (FIG. 3, step 104). Dispensing underfill 60 to fill gap 62 includes dispensing underfill 60 to contact dielectric layer 44 adjacent to copper pillars 46.

In an example, an underfill dispense process applies an adequate volume of underfill 60 through a needle to the surface of semiconductor die 40 along one side of sensor coil 34. Capillary action draws the viscous underfill into the entire narrow gap 62. Underfill 60 flows under sensor coil 34 from one side by capillary action such that is free of voids which might allow negatively impact the electrical isolation of sensor coil 34 from semiconductor die 40.

In some examples, underfill 60 may be applied to gap 62 as a viscous polymeric precursor dispensed onto dielectric layer 44 (FIG. 1D) of semiconductor die 40 adjacent to sensor coil 34 and be pulled into gap 62 by capillary forces. In other examples, underfill 60 may be dispensed onto sensor coil 34 adjacent to semiconductor die 40 and be pulled into gap 62 by capillary forces; however, such examples would require underfill 60 to flow along a length of sensor coil 34 from the edge of semiconductor die 40, rather than a width of sensor coil 34 as when underfill is applied to semiconductor die 40 adjacent to sensor coil 34. In yet other examples, underfill 60 may be applied to either semiconductor die 40 or sensor coil 34 before semiconductor die 40 is mounted to die attach site 24.

Figure 2C:
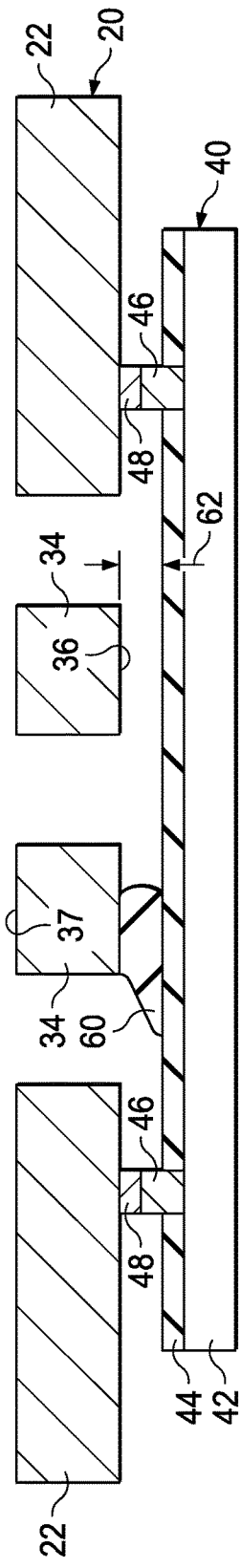
Figure 2D:
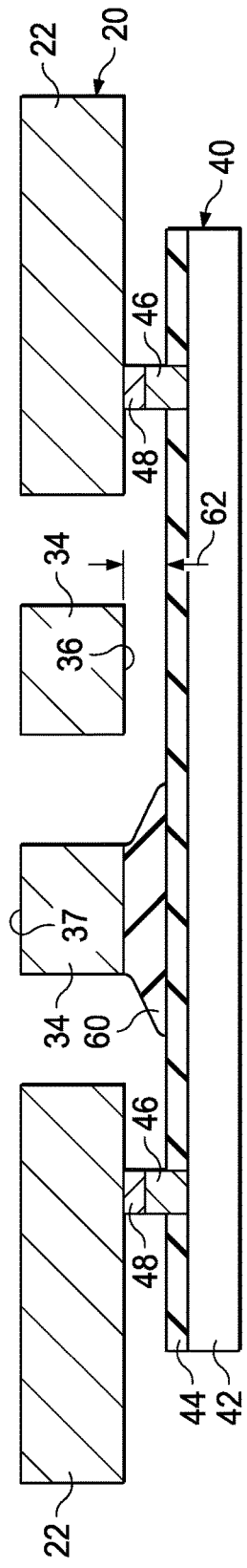
Figure 2E:
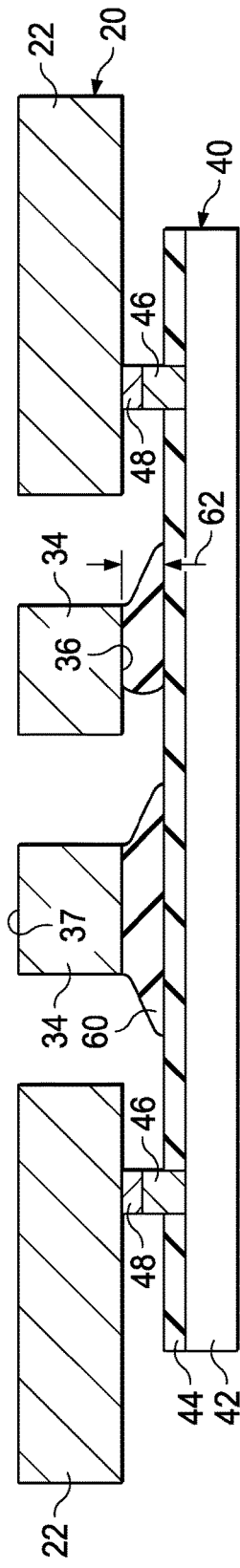

In FIG. 2C, underfill 60 is applied to dielectric layer 44 of semiconductor die 40 along an outer circumference of sensor coil 34. As shown in FIG. 2D, capillary flow action draws the viscous underfill into the entire narrow gap 62 until is flows out the inner circumference of sensor coil 34. As shown in FIG. 2E, underfill 60 continues to be applied to dielectric layer 44 of semiconductor die 50 along the outer circumference of sensor coil 34. As shown in FIG. 2E, capillary flow action draws the viscous underfill into the entire narrow gap 62 until is flows out the inner circumference of sensor coil 34 and intersects with underfill that flowed out the inner circumference of sensor coil 34 on the opposite side of sensor coil 34. Thus, entirety of gap 62 along the half turn of sensor coil 34 is filled with underfill 60. Following the filling of gap 62, the viscous polymeric precursor is cured to form a solid dielectric barrier between sensor coil 34 and semiconductor die 40.

Figure 2F:
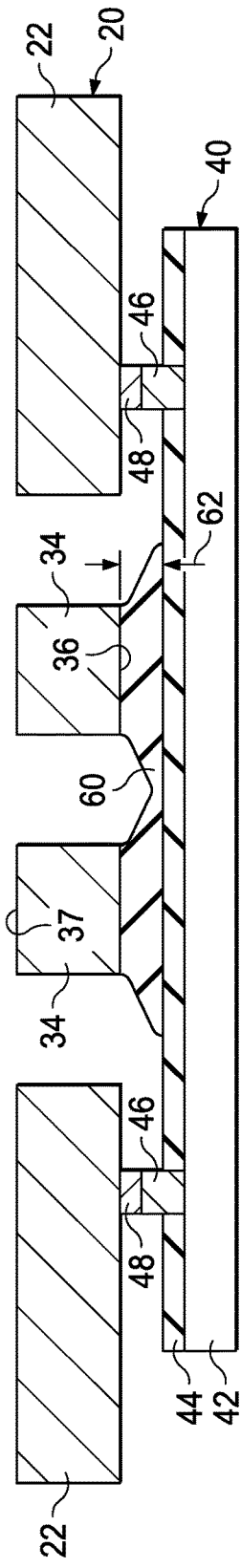
Figure 2G:
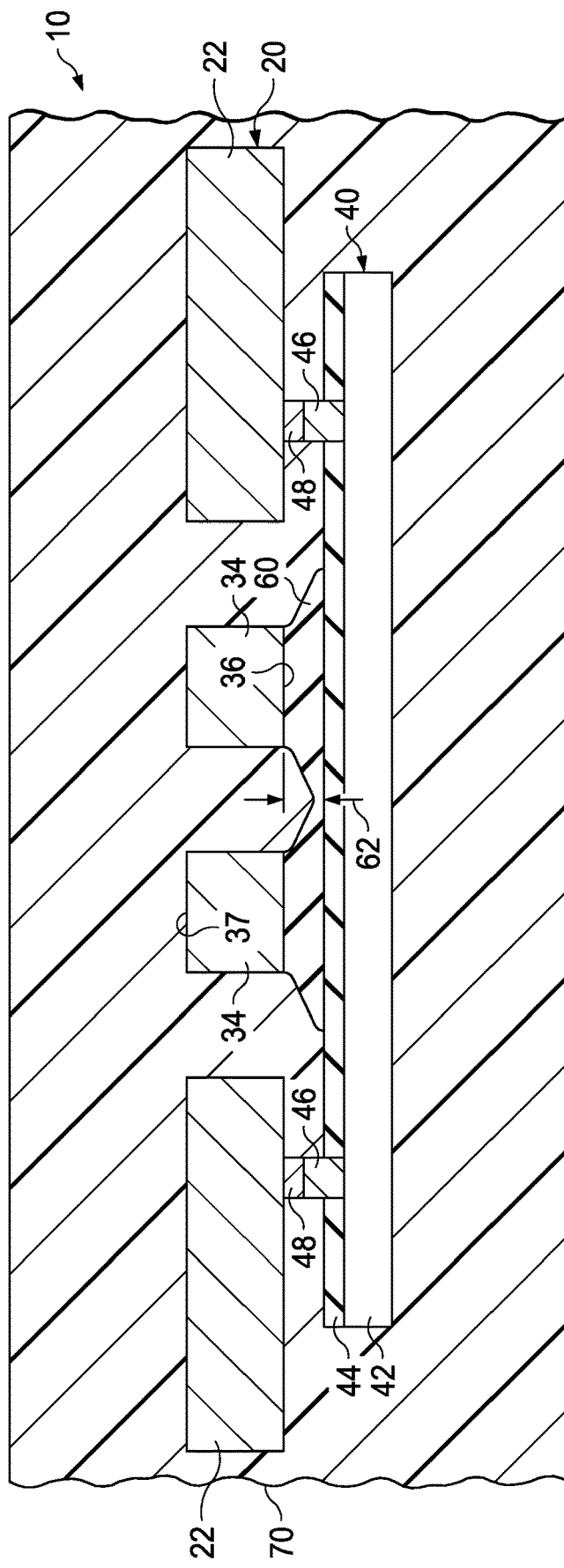

As shown in FIG. 2G, the assembly of FIG. 2F is molded to cover semiconductor die 40, sensor coil 34 and underfill 60 and at least partially cover die leads 22 and sensor coil leads 34 with mold compound 70, such as by placing the subassembly of FIG. 2F, including leadframe 20, semiconductor die 40, and underfill 60, in a mold cavity and transfer molding the subassembly (FIG. 3, step 106). In some examples, the assembly of FIG. 2F is molded with the viscous polymeric precursor of underfill 60 and underfill 60 is cured at the same time as mold compound 70.

In some examples, semiconductor package 10 may be manufactured as part of an array of semiconductor packages on a common leadframe strip. In such examples, semiconductor die 40 is one of a plurality of semiconductor dies mounted on a plurality of leadframes in the leadframe strip, the plurality of leadframes including leadframe 20. Following the mounting of the plurality of semiconductor dies, underfill is applied to gaps between the plurality of semiconductor dies and sensor coils of the leadframes. Mold compound 70 is then applied to each of the semiconductor packages on the leadframe strip with a single molding operation. Following molding of mold compound 70, semiconductor package 10 may be singulated from the array of interconnected semiconductor packages of the common mold (FIG. 3, step 108). For example, singulation may include cutting the leadframe strip including leadframe 20 and mold compound 70 within spaces separating the plurality of semiconductor dies from each other with a saw or other cutting implement.

Following singulation to form discrete semiconductor packages 10, leads 22, 32 extend beyond mold compound 70. Leads 22, 32 may then be bent as cantilevered leads suitable for surface mounting semiconductor package 10 to an external board, such as printed circuit board (PCB). In some examples, lead bending and singulation may occur in a single operation. In other examples, semiconductor packages including underfill within a gap between a sensor coil and a semiconductor die of the semiconductor package may include another lead configuration, such as, but not limited to, flat no-leads semiconductor package, such as quad-flat no-leads (QFN) or dual-flat no-leads (DFN). In such operations, singulation may including cutting through a common mold covering the plurality of leadframes of a leadframe strip to expose the electrical contacts for each discrete package of the leadframe strip.

Following singulation, semiconductor package 10 may be tested or placed into operation. In examples where semiconductor die 40 includes an analog magnetic sensor, such as a Hall sensor, and a controller, operation or testing of semiconductor package 10 may include receiving, with the controller, an analog input representing the magnetic fields created by electrical current through sensor coil 34 from the sensor, and outputting, with the controller, digital signals representative of the electrical current through sensor coil 34 via one or more of die leads 22.

The specific techniques for semiconductor packages including underfill within a gap between a sensor coil and a semiconductor die of the semiconductor package, such as semiconductor package 10, are merely illustrative of the general inventive concepts included in this disclosure as defined by the following claims.

What is claimed is:

1. A semiconductor package comprising:
   a leadframe including a sensor coil between sensor coil leads and further including a plurality of die leads physically and electrically separated from the sensor coil;
   a semiconductor die over the leadframe with die contacts electrically connected to the die leads, wherein the semiconductor die includes a sensor operable to detect magnetic fields created by electrical current through the sensor coil, the semiconductor die operable to output a signal representative of the detected magnetic fields via the die leads;
   a dielectric underfill filling a gap between the sensor coil and the semiconductor die but not filling a gap between the die leads and the semiconductor die; and a dielectric mold compound covering the sensor coil and the dielectric underfill and at least partially covering the semiconductor die and the die leads.

2. The semiconductor package of claim 1, wherein the dielectric underfill is substantially free of voids.

3. The semiconductor package of claim 1, wherein the dielectric underfill is free of voids.

4. The semiconductor package of claim 1,
wherein the semiconductor die includes a dielectric layer forming openings with the die contacts exposed within the openings of the dielectric layer, and
wherein the dielectric underfill contacts the dielectric layer adjacent to the die contacts.

5. The semiconductor package of claim 1,
wherein die contacts face the die leads, and
wherein die contacts include metal pillars with solder caps electrically connecting the die contacts to the die leads in a flip chip configuration.

6. The semiconductor package of claim 1, wherein the gap between the sensor coil and the semiconductor die is between 20 to 200 micrometers.

7. The semiconductor package of claim 1, wherein the sensor coil is a partial turn sensor coil formed in a planar profile with the sensor coil leads.

8. The semiconductor package of claim 1, wherein the sensor coil is a half-turn sensor coil.

9. The semiconductor package of claim 1, wherein the dielectric underfill includes silica fillers.

10. The semiconductor package of claim 1,
wherein the dielectric underfill includes underfill particulate fillers,
wherein a maximum diameter of the underfill particulate fillers is less than the gap between the sensor coil and the semiconductor die,
wherein the dielectric mold compound includes mold compound particulate fillers, and
wherein a maximum diameter of the mold compound particulate fillers is greater than the gap between the sensor coil and the semiconductor die.

11. The semiconductor package of claim 1, wherein the dielectric mold compound includes a thermoset resin.

12. The semiconductor package of claim 1, wherein the sensor coil leads and exposed portions of the die leads are bent in a common direction outside the mold compound.

13. The semiconductor package of claim 1, wherein all the sensor coil leads and the die leads include apertures filled with the mold compound.

14. The semiconductor package of claim 1, wherein the semiconductor die is an integrated circuit including the sensor and a controller configured to receive an analog input from the sensor and output the signal representative of the detected magnetic fields as a digital signal representative of the electrical current through the sensor coil.

15. The semiconductor package of claim 1, wherein the sensor includes a Hall effect sensor.

16. A method of forming a semiconductor package comprising:
mounting a semiconductor die to a leadframe, the leadframe including a sensor coil between sensor coil leads and further including a plurality of die leads physically and electrically separated from the sensor coil,
wherein mounting the semiconductor die to the leadframe includes electrically connecting die contacts of the leadframe to the die leads,
wherein the semiconductor die includes a sensor operable to detect magnetic fields created by electrical current through the sensor coil, the semiconductor die operable to output a signal representative of the detected magnetic fields via the die leads;
dispensing a dielectric underfill to fill a gap between the sensor coil and the semiconductor die but not fill a gap between the die leads and the semiconductor die; and
molding a dielectric mold compound to cover the sensor coil and the dielectric underfill and at least partially cover the semiconductor die and the die leads.

17. The method of claim 16, wherein the dielectric underfill is substantially free of voids.

18. The method of claim 16, wherein the dielectric underfill is free of voids.

19. The method of claim 16, wherein dispensing the dielectric underfill to fill the gap includes dispensing the dielectric underfill along one side of the sensor coil to fill the gap by capillary action.

20. The method of claim 16,
wherein the semiconductor die includes a dielectric layer forming openings with the die contacts exposed within the openings of the dielectric layer, and
wherein dispensing the dielectric underfill to fill the gap between the sensor coil and the semiconductor die includes dispensing the dielectric underfill to contact the dielectric layer adjacent to the die contacts.

21. The method of claim 20, wherein dispensing the dielectric underfill to fill the gap includes dispensing the dielectric underfill on the dielectric layer adjacent the sensor coil to fill the gap by capillary action.

22. The method of claim 16, wherein dispensing the dielectric underfill to fill the gap includes dispensing the dielectric underfill on the sensor coil to fill the gap by capillary action.

23. The method of claim 16, wherein dispensing the dielectric underfill to fill the gap includes dispensing the dielectric underfill on either the semiconductor die or the sensor coil before mounting the semiconductor die to the leadframe.

24. The method of claim 16, wherein mounting the semiconductor die to the leadframe includes reflowing a set of solder caps on metal pillars extending from the die contacts to form electrical connections between the die contacts and the die leads in a flip chip configuration.

25. The method of claim 16, wherein the sensor coil is a partial turn sensor coil formed in a planar profile of the leadframe.

26. The method of claim 16, wherein transfer molding the dielectric mold compound includes placing a subassembly comprising the leadframe, the semiconductor die, and the underfill in a mold cavity.

27. The method of claim 16, wherein transfer molding the dielectric mold compound includes filling apertures in the sensor coil leads and of the die leads with the mold compound.

28. The method of claim 16, wherein the semiconductor die is an integrated circuit including the magnetic sensor and a controller, the method further comprising:
receiving, with the controller, an analog input representing the magnetic fields created by the electrical current through the sensor coil from the sensor; and
outputting, with the controller, digital signals representative of the electrical current through the sensor coil via one or more of the die leads.

29. The method of claim 16,
wherein the semiconductor die is one of a plurality of semiconductor dies mounted on a plurality of leadframes in a leadframe strip, the plurality of leadframes including the leadframe;

wherein transfer molding the dielectric mold compound to cover the sensor coil and the dielectric underfill and at least partially cover the semiconductor die and the die leads includes at least partially covering the plurality of semiconductor dies and leadframes in the leadframe strip with mold compound, the method further comprising singulating the semiconductor package from the leadframe strip by cutting the leadframe strip within spaces separating the plurality of semiconductor dies from each other.

* * * * *